US012796309B2

(12) United States Patent
Mei

(10) Patent No.: US 12,796,309 B2

(45) Date of Patent: Nov. 10, 2026

(54) QUANTUM DOT FILM LAYER, QUANTUM DOT LIGHT-EMITTING DEVICE, AND FABRICATION METHOD

(71) Applicant: BOE Technology Group Co., Ltd., Beijing (CN)

(72) Inventor: Wenhai Mei, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 826 days.

(21) Appl. No.: 18/031,737

(22) PCT Filed: Dec. 15, 2020

(86) PCT No.: PCT/CN2020/136556

§ 371 (c)(1),
(2) Date: Apr. 13, 2023

(87) PCT Pub. No.: WO2022/126382

PCT Pub. Date: Jun. 23, 2022

(65) Prior Publication Data

US 2023/0389406 A1 Nov. 30, 2023

(51) Int. Cl.

| | |
|---|---|
| ***H10K 85/30*** | (2023.01) |
| ***C09K 11/02*** | (2006.01) |
| ***C09K 11/06*** | (2006.01) |
| ***H10K 50/115*** | (2023.01) |

(52) U.S. Cl.

CPC ............ *H10K 85/30* (2023.02); *C09K 11/025* (2013.01); *C09K 11/06* (2013.01); *H10K 50/115* (2023.02)

(58) Field of Classification Search

CPC .... H10K 85/30; H10K 50/115; C09K 11/025; C09K 11/06

USPC ..................................................... 252/301.33

See application file for complete search history.

(56) References Cited

U.S. PATENT DOCUMENTS

| | | |
|---|---|---|
| 2005/0117868 A1 | 6/2005 | Chen et al. |
| 2018/0108842 A1 | 4/2018 | Li et al. |
| 2019/0207137 A1 | 7/2019 | Mei |

FOREIGN PATENT DOCUMENTS

| | | | | |
|---|---|---|---|---|
| CN | 105552241 A | | 5/2016 | |
| CN | 106531860 A | | 3/2017 | |
| CN | 106957650 A | | 7/2017 | |
| CN | 107955597 A | | 4/2018 | |
| CN | 108129661 A | | 6/2018 | |
| CN | 109148699 A | | 1/2019 | |
| CN | 109935709 A | | 6/2019 | |
| CN | 110224074 A | * | 9/2019 | ........... H10K 50/115 |

OTHER PUBLICATIONS

CN-110224074-A English translation (Year: 2019).*
CN202080003337.1 first office action.
PCT/CN2020/136556 international search report.

* cited by examiner

*Primary Examiner* — Anita Nassiri-Motlagh

(74) *Attorney, Agent, or Firm* — IPro, PLLC

(57) ABSTRACT

Provided are a quantum dot film layer, a quantum dot light-emitting device, and a fabrication method. The quantum dot film layer includes: quantum dots; a bonding structure, one end of the bonding structure being connected with the quantum dots; and a fluorine-containing aromatic structure, the fluorine-containing aromatic structure being connected with the other end of the bonding structure to connect with the quantum dots by means of the bonding structure.

18 Claims, 4 Drawing Sheets

QUANTUM DOT FILM LAYER, QUANTUM DOT LIGHT-EMITTING DEVICE, AND FABRICATION METHOD

CROSS REFERENCE TO RELATED APPLICATIONS

The present disclosure is a National Stage of International Application No. PCT/CN2020/136556, filed Dec. 15, 2020.

FIELD

The present disclosure relates to the technical field of semiconductors, and particularly relates to a quantum dot film layer, a quantum dot light-emitting device, and a manufacturing method.

BACKGROUND

A quantum dots light emitting diode display (QLED) is a novel display upgraded from an organic light emitting display. The difference between them lies in that a light-emitting layer of the QLED is a quantum dot layer, a principle of which is that electrons/holes are injected into the quantum dot layer by means of an electron/hole transport layer and then recombine to emit light in the quantum dot layer. Compared with an organic light emitting diode display (OLED), the QLED has the advantages of a narrow light emitting peak, high color saturation and a wide color gamut.

SUMMARY

Embodiment of the present disclosure is a quantum dot film layer, including:

a quantum dot;

a bonding structure, one end of the bonding structure being connected with the quantum dot; and a fluorine-containing aromatic hydrocarbon structure, the fluorine-containing aromatic hydrocarbon structure being connected with the other end of the bonding structure to connect with the quantum dot by means of the bonding structure.

In some embodiments, a general formula of the fluorine-containing aromatic hydrocarbon structure includes at least one of:

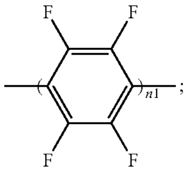

or

-continued

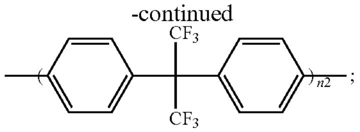

where n1≤6, and n2≤6.

In some embodiments, the bonding structure includes one of:

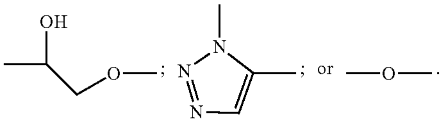

In some embodiments, the bonding structure is formed by a grafting reaction of a first group and a second group, the first group is a group connected with the quantum dot before the grafting reaction, and the second group is a group connected with the fluorine-containing aromatic hydrocarbon structure before the grafting reaction.

In some embodiments, the first group includes one of:

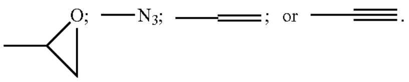

In some embodiments, the second group includes one of:

—OH; or

—$N_3$.

In some embodiments, the quantum dot film layer further includes: a coordinating group connected with the quantum dot, where the bonding structure is connected with the quantum dot by means of the coordinating group.

In some embodiments, the coordinating group includes one of:

a mercapto group;

an amino group; or a carboxyl group.

In some embodiments, the quantum dot film layer further includes: an aliphatic chain connected between the coordinating group and the bonding structure.

In some embodiments, the number of carbon atoms of a backbone carbon chain of the aliphatic chain is greater than 0 and not less than 8.

In some embodiments, the quantum dot film layer includes a structure as follows:

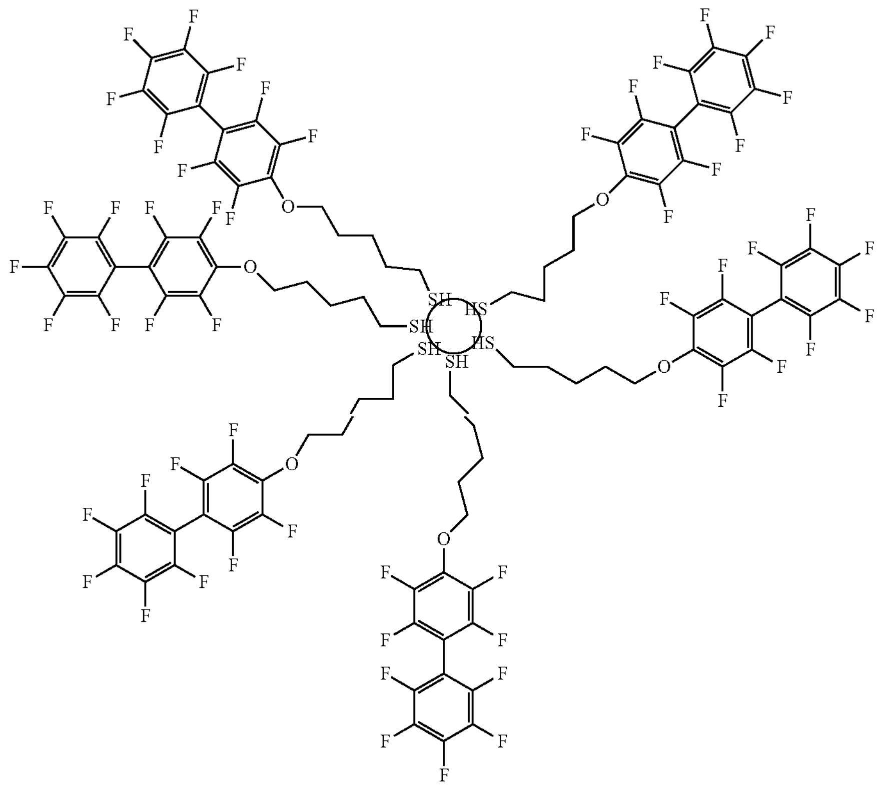

In some embodiments, a maximum distance between the quantum dot and the fluorine-containing aromatic hydrocarbon structure is greater than a first distance; and the first distance is a distance between an end of the first group facing away from the quantum dot and the quantum dot before the grafting reaction.

In some embodiments, a distance between adjacent quantum dots is greater than a second distance, and the second distance is a distance between two adjacent quantum dots before the grafting reaction.

Embodiments of the present disclosure further provide a quantum dot light-emitting device, including the quantum dot film layer provided in the embodiments of the present disclosure.

Embodiments of the present disclosure further provide a manufacturing method for a quantum dot film layer, including:

forming a first quantum dot film layer on a side of a substrate, where the first quantum dot film layer includes a quantum dot, and a first group connected with the quantum dot;

forming a solution containing a modification ligand on a side of the first quantum dot film layer facing away from the substrate, where the modification ligand includes a fluorine-containing aromatic hydrocarbon structure, and a second group connected with the fluorine-containing aromatic hydrocarbon structure; and causing a grafting reaction between the first group and the second group under a preset condition, to form a bonding structure, so as to link the fluorine-containing aromatic hydrocarbon structure to the quantum dot by means of the bonding structure.

In some embodiments, the forming a first quantum dot film layer on a side of a substrate includes: forming the first quantum dot film layer containing a structural formula on a side of the substrate, and the structural formula is as follows:

$R_1$—$R_2$—$R_3$, where R1 is a coordinating group connected with the quantum dot, R2 is an aliphatic chain, and R3 is the first group.

In some embodiments, the forming a first quantum dot film layer on a side of a substrate includes: forming the first quantum dot film layer containing the first group on a side of the substrate, and the first group includes one of:

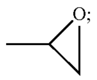; —$N_3$; ; or 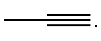.

In some embodiments, the forming a solution containing a modification ligand on a side of the first quantum dot film layer facing away from the substrate includes: forming the modification ligand containing a structural formula on a side of the first quantum dot film layer facing away from the substrate, and the structural formula is as follow:

Y—$R_5$; where Y is the fluorine-containing aromatic hydrocarbon structure, and R5 is the second group.

In some embodiments, the forming a solution containing a modification ligand on a side of the first quantum dot film layer facing away from the substrate includes: forming the modification ligand containing the second group on a side of the first quantum dot film layer facing away from the substrate, and the second group comprises one of:

—OH; or

—$N_3$.

In some embodiments, the causing a grafting reaction between the first group and the second group under a preset condition includes: causing the first group to react with the second group by light or heat.

DETAILED DESCRIPTION OF THE EMBODIMENTS

In order to make the objectives, technical solutions, and advantages in the embodiments of the present disclosure clearer, the technical solutions in the embodiments of the present disclosure will be clearly and completely described below in combination with the accompanying drawings in the embodiments of the present disclosure. It is obvious that the described embodiments are some embodiments rather than all embodiments of the present disclosure. Based on the described embodiments of the present disclosure, all other embodiments derived by those of ordinary skill in the art without creative efforts fall within the scope of protection of the present disclosure.

Unless otherwise defined, technical or scientific terms used in the present disclosure should have ordinary meaning as understood by those of ordinary skill in the art to which the present disclosure belongs. “First”, “second” and similar words used in the present disclosure do not indicate any order, quantity or importance, but are only used for distinguishing different components. “Comprise”, “include” and similar words are intended to mean that an element or item in front of the word encompasses elements or items that are listed behind the word and their equivalents, but do not exclude other elements or items. “Connection”, “connected” and similar words are not limited to a physical or mechanical connection, but can include a direct or indirect electrical connection. “Upper”, “lower”, “left”, “right”, etc. are merely used to indicate a relative position relation, which may also change accordingly when an absolute position of a described object changes.

In order to keep the following descriptions of embodiments of the present disclosure clear and concise, the present disclosure omits detailed descriptions of known functions and known components.

A luminescent yield of a quantum dot solution in a quantum dots light emitting diode display (QLED) device is high, which can reach 80% or higher. However, a quantum yield of a film prepared from a solution tends to decrease dramatically, which is mainly due to a large range of motion of solution-state quantum dots with a large distance between each other; and after formation of a dense film, distances between quantum dots decrease, the probability of Foster energy transfer increases, and some of them are released in a form of non-radiative recombination, which decreases a fluorescence quantum yield of the quantum dot film. In view of this phenomenon, some researches increase distances between quantum dots by increasing a thickness of a housing outside the quantum dots, but the too thick housing is likely to hinder the transport of carriers, which results in the decrease in device efficiency.

Figure 1:
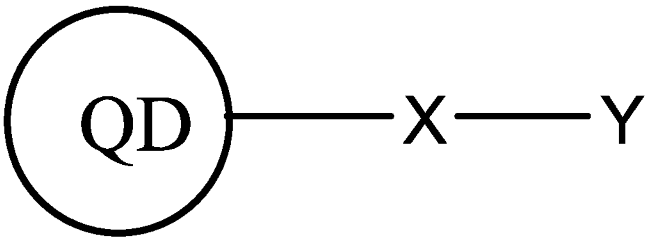
FIG. 1 shows a first structure contained in a quantum dot film layer provided in an embodiment of the present disclosure.

In view of this, with reference to FIG. 1, provided in the embodiment of the present disclosure is a quantum dot film layer, including:

a quantum dot QD;

a bonding structure X, one end of the bonding structure X being connected with the quantum dot QD; and a fluorine-containing aromatic hydrocarbon structure Y, the fluorine-containing aromatic hydrocarbon structure Y being connected with the other end of the bonding structure X, so as to be connected with the quantum dot QD by means of the bonding structure X.

In the embodiment of the present disclosure, the quantum dot film layer includes the fluorine-containing aromatic hydrocarbon structure Y connected with the quantum dot QD by means of the bonding structure X. On one hand, a repulsion force of fluorine-containing groups in the fluorine-containing aromatic hydrocarbon structure Y is used, that is, a compact structure of electron cloud outside a fluorine atom can hardly affect an external field, and an induced effect caused by the approach to other molecules is also minimal, such that the molecules exhibit a strong repulsion force. On the other hand, a large steric hindrance effect of an aromatic unit in the fluorine-containing aromatic hydrocarbon structure Y is used. In this way, the distance between adjacent quantum dots in the quantum dot film layer may be increased, and the problem that energy transfer occurs due to approach of the quantum dots, resulting in a decrease in luminescence yield is avoided.

In some embodiments, the quantum dot film layer in the embodiment of the present disclosure may be a light emitting layer in a quantum dot light-emitting device. The quantum dot light-emitting device may be a quantum dot light-emitting device emitting monochromatic light, for example, a quantum dot light-emitting device emitting monochromatic red light, a quantum dot light-emitting device emitting green light, and a quantum dot light-emitting device emitting blue light. The quantum dot light-emitting device may also be a display device emitting a plurality of colors of light. As a light-emitting layer of the device, the quantum dot film layer may In some embodiments include a plurality of quantum dot light-emitting portions emitting a plurality of different colors of light. For example, the quantum dot film layer includes: a red quantum dot light-emitting portion emitting red light, a green quantum dot light-emitting portion emitting green light, and a blue quantum dot light-emitting portion emitting blue light.

In some embodiments, a general formula of the fluorine-containing aromatic hydrocarbon structure includes at least one of:

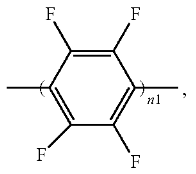

for example, when n1=1, the fluorine-containing aromatic hydrocarbon structure Y is hexafluorobenzene, and is

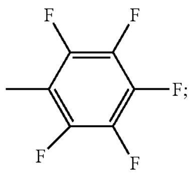

and when n1=2, the fluorine-containing aromatic hydrocarbon structure Y is decafluorobiphenyl and is

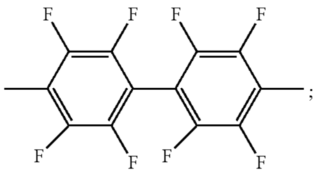

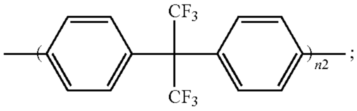

where n1≤6, and n2≤6.

In some embodiments, the more aromatic rings are, the greater steric hindrance is, which is beneficial to increase in the distance between quantum dots. However, the excessive fluorine-containing aromatic ring structures influence a transport rate of carriers in the quantum dot film layer, and are unfavorable to a higher luminescence yield of the quantum dot film layer. In the embodiment of the present disclosure, n1≤6, and n2≤6, such that the quantum dot film layer may have a larger distance between adjacent quantum dots, the problem that energy transfer occurs due to approach of the quantum dots, resulting in a decrease in luminescence yield is avoided, and the quantum dot film layer may further have a better transport rate of carriers.

In some embodiments, the bonding structure X includes one of:

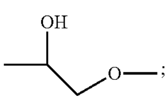 ; 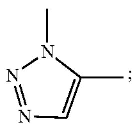 ; or —O—.

Figure 2:
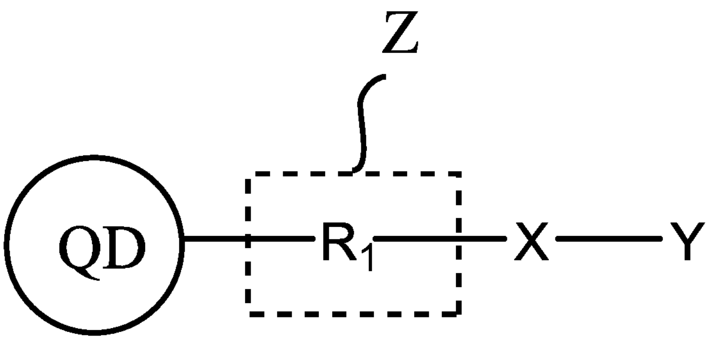
FIG. 2 shows a second structure contained in a quantum dot film layer provided in an embodiment of the present disclosure.
Figure 3:
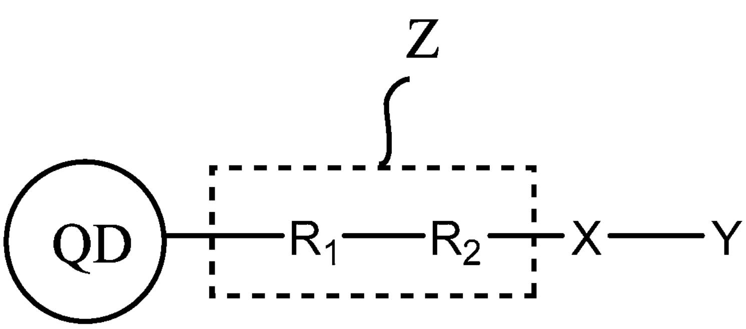
FIG. 3 shows a third structure contained in a quantum dot film layer provided in an embodiment of the present disclosure.

In some embodiments, the bonding structure X may be directly connected with the quantum dot QD, as shown in FIG. 1. As shown in FIGS. 2 and 3, a connection structure Z may also be connected between the bonding structure X and the quantum dot QD. For example, as shown in FIG. 2, the connection structure Z may include a coordinating group R1 connected with the quantum dot QD, and the bonding structure X is connected with the quantum dot QD by means of the coordinating group R1. For another example, as shown in with FIG. 3, the connection structure Z may further include a coordinating group R1 connected with the quantum dot QD, and an aliphatic chain R2 connected with the coordinating group R1, the aliphatic chain R2 is connected between the coordinating group R1 and the bonding structure X, and the bonding structure X is connected with the quantum dot QD by means of the aliphatic chain R2 and the coordinating group R1.

In some embodiments, the bonding structure X may be formed by a grafting reaction of a first group R3 and a second group R5, the first group R3 is a group connected with the quantum dot QD before the grafting reaction, and the second group is a group linked to the fluorine-containing aromatic hydrocarbon structure before the grafting reaction.

In some embodiments, a structure connected with the quantum dot before the grafting reaction is

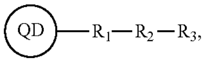

where R1 is a coordinating group connected with the quantum dot QD, and the coordinating group may be a mercapto group (—SH), an amino group (—NH2), or a carboxyl group (—COOH), and may be a group capable of coordinating with the quantum dot QD. R2 is an aliphatic chain (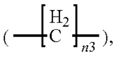), 0<n3≤8, and the length of the backbone carbon chain of the aliphatic chain R2 is not more than 8 carbon atoms, so as to make a carrier have a better transport rate in the quantum dot film layer. R3 is a first group. In some embodiments, R3 is a group capable of undergoing a photoreaction or a thermal reaction, for example, an epoxy group (), an azide (—$N_3$), an alkene (), or an alkyne ().

Before the grafting reaction, an overall structural formula connected with the fluorine-containing aromatic hydrocarbon structure Y may be: Y—$R_5$, where Y is a fluorine-containing aromatic hydrocarbon structure, and the fluorine-containing aromatic hydrocarbon structure may be hexafluorobenzene, decafluorobiphenyl, and hexafluorobisphenol A. R5 is a second group, and R5 is a group capable of reacting with the R3 group, including an azide (—$N_3$) reacting with an alkyne, and a hydroxyl (—OH) reacting with an epoxy.

In some embodiments, before the grafting reaction, a structure connected with the quantum dot is

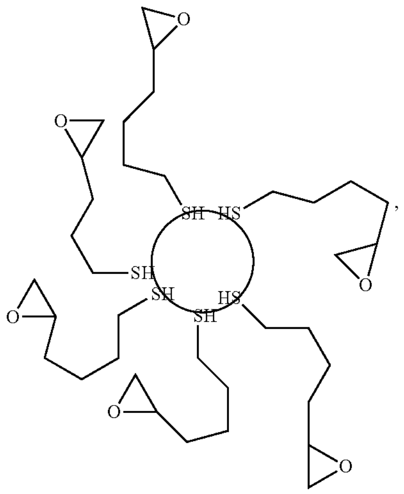

where —SH— is the coordinating group R1,

is the first group R3, and a structure between —SH— and

is the aliphatic chain R2.

Before the grafting reaction, a side structure having a fluorine-containing aromatic hydrocarbon structure is

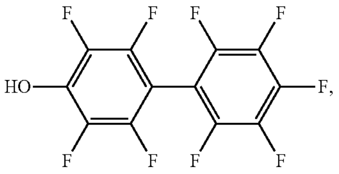 [SMILES: Oc1c(F)c(F)c(-c2c(F)c(F)c(F)c(F)c2F)c(F)c1F]

where

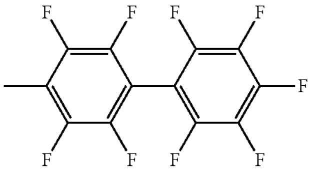 [SMILES: Cc1c(F)c(F)c(-c2c(F)c(F)c(F)c(F)c2F)c(F)c1F]

is the fluorine-containing aromatic hydrocarbon structure Y, and —OH is a second group R5.

The grafting reaction is as follows:

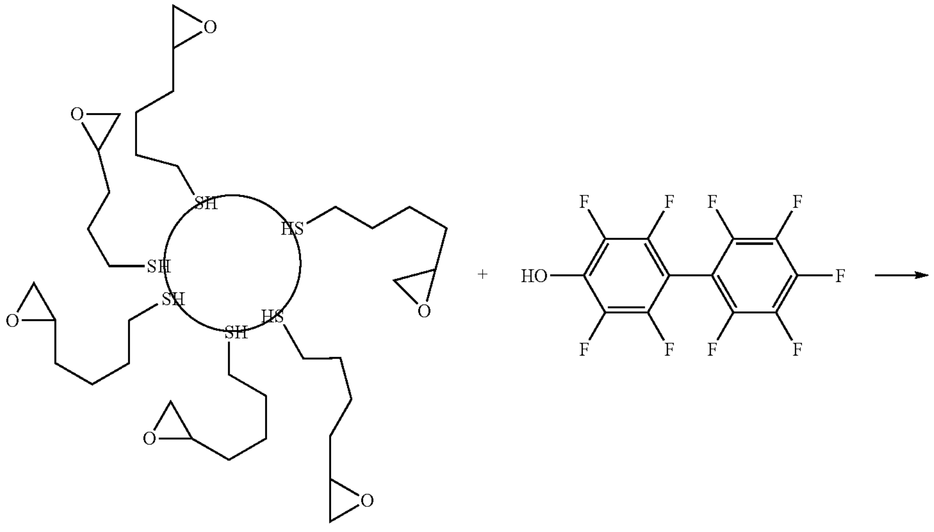

-continued
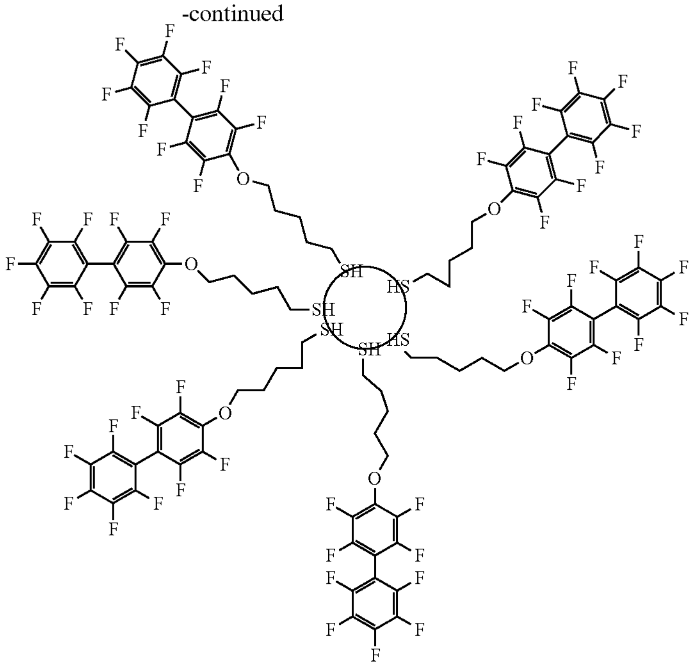
The structure contained in the finally formed quantum dot film layer is:
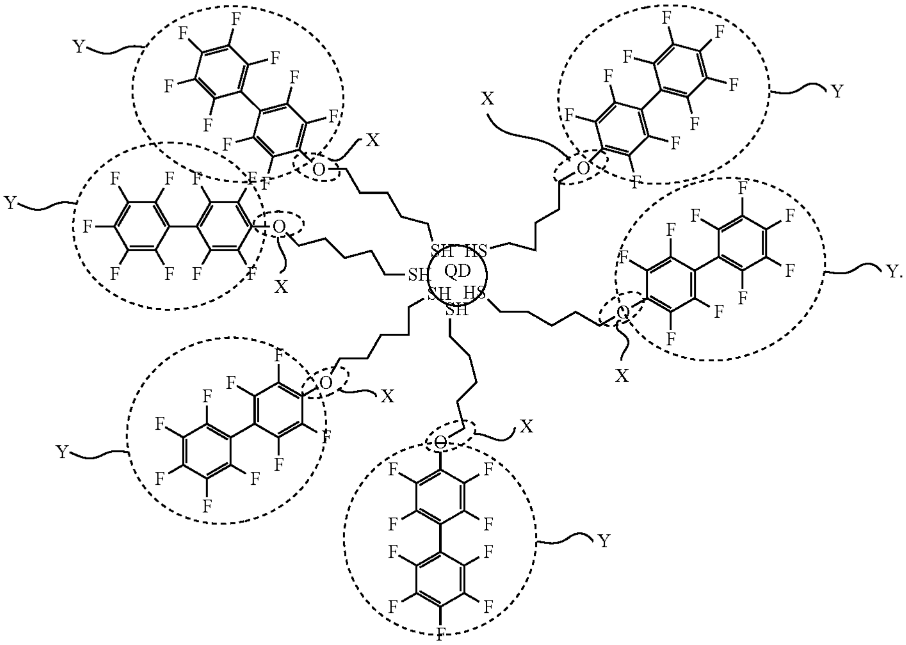
Y.

Certainly,

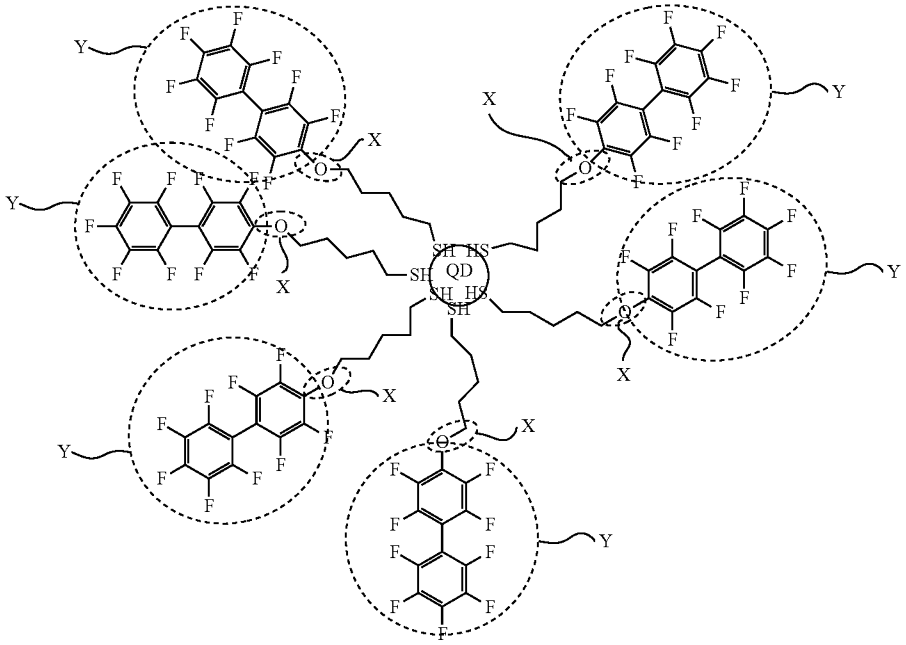

as given above, it is only a structure contained in the quantum dot film layer formed by a grafting reaction. In some embodiments, the quantum dot film layer may also be in a particular form containing other forms, which the embodiment of the present disclosure does not limit.

It can be seen from the above reaction formula that an original structure of the quantum dot QD generally contains an aliphatic hydrocarbon, and when a film state is formed, the aliphatic chain generally forms a curved surrounding structure. Under the condition that the fluorine-containing aromatic hydrocarbon structure provided in the embodiments of the present disclosure is grafted, ligand chains in the same quantum dot no longer intertwine with each other due to the repulsion of fluorine atoms. The ligand chains between quantum dots are separated as much as possible, and the large steric hindrance effect of aromatic rings also prevents the interpenetration between quantum dots. By combining the two factors, the distance between quantum dots is enlarged, which reduces the probability of Foster energy transfer between quantum dots.

Figure 4:
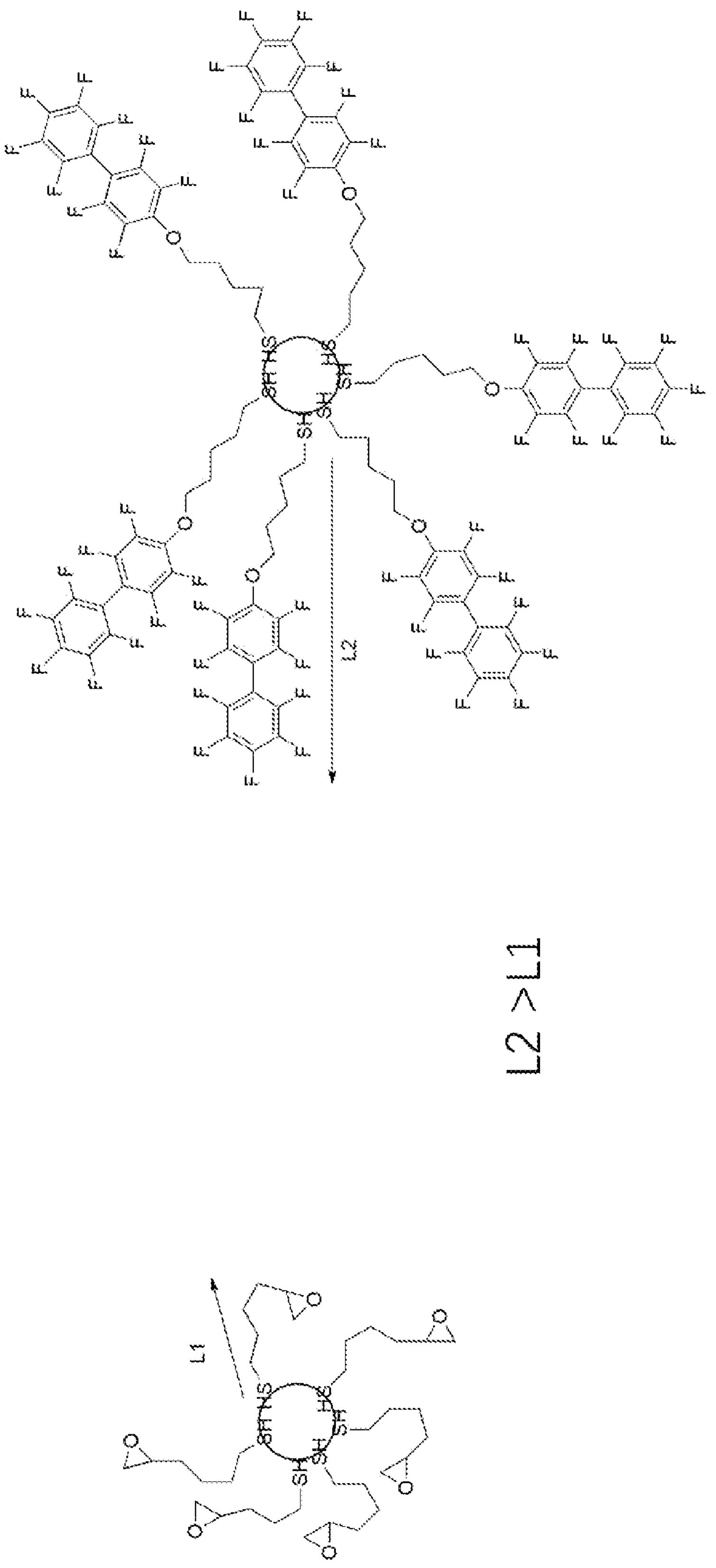
FIG. 4 is a schematic diagram of comparing chain lengths of a quantum dot before and after a grafting reaction according to an embodiment of the present disclosure.

In some embodiments, as shown in FIG. 4, a maximum distance L2 between the quantum dot QD and the fluorine-containing aromatic hydrocarbon structure Y is greater than a first distance L1, and the first distance L1 is a distance between an end of the first group R3

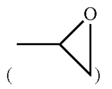

facing away from the quantum dot QD and the quantum dot QD before the grafting reaction. In some embodiments, as shown in FIG. 4, the maximum distance between the quantum dot QD and the fluorine-containing aromatic hydrocarbon structure Y may be understood as a distance between the end of the fluorine-containing aromatic hydrocarbon structure Y facing away from the quantum dot QD and the quantum dots QD.

Figure 5:
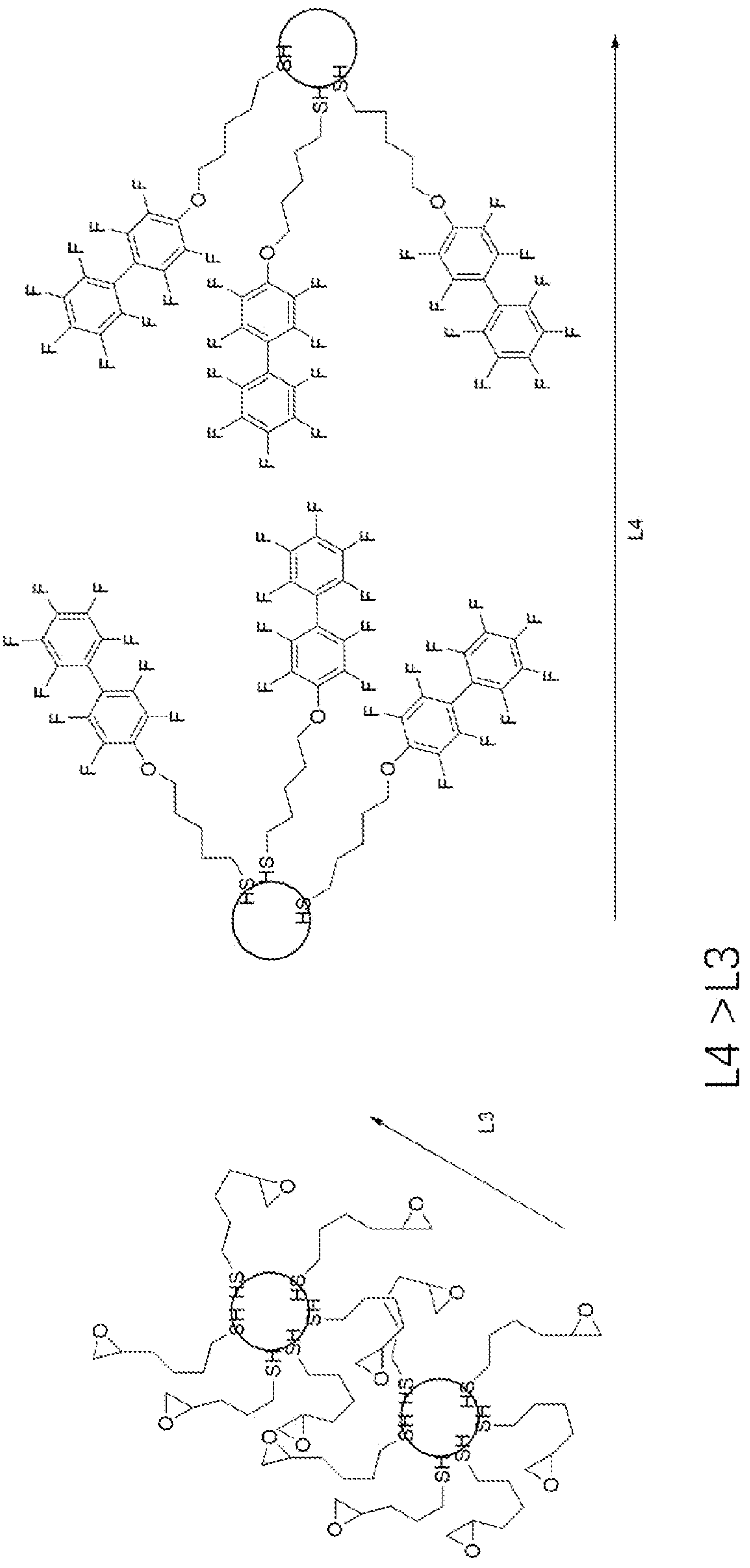
FIG. 5 is a schematic diagram of distances between adjacent quantum dots before and after a grafting reaction according to an embodiment of the present disclosure.

In some embodiments, as shown in FIG. 5, the distance L4 between adjacent quantum dots QD is greater than a second distance L3, and the second distance L3 is a distance between two adjacent quantum dots QD before the grafting reaction.

Based on the same inventive concept, embodiment of the present disclosure further provides a quantum dot light-emitting device, including the quantum dot film layer provided in the embodiment of the present disclosure.

Figure 6:
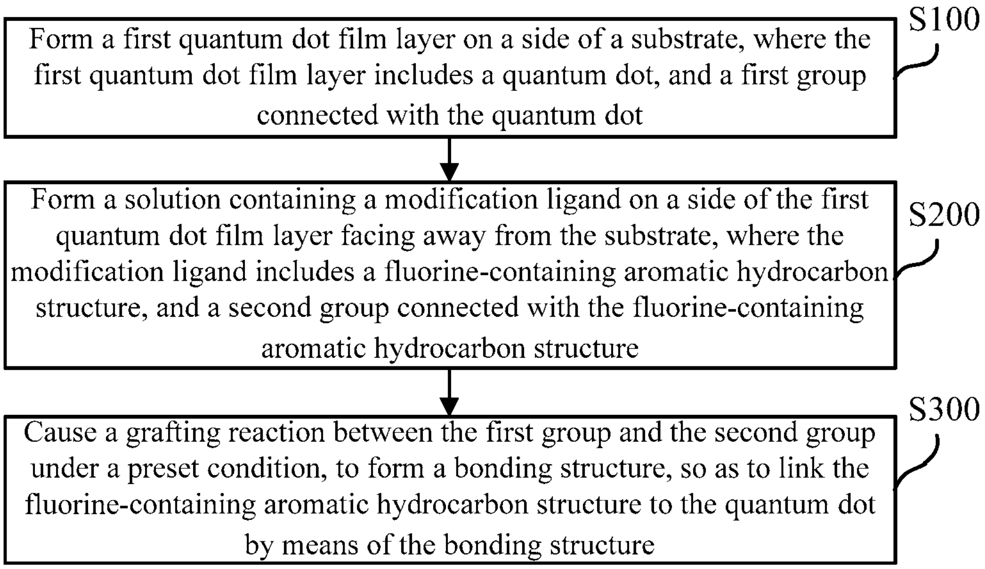
FIG. 6 is a schematic diagram of a manufacturing method for a quantum dot film layer according to an embodiment of the present disclosure.

Based on the same inventive concept, as shown in FIG. 6, embodiment of the present disclosure further provides a manufacturing method for a quantum dot film layer, including the following steps.

S100, form a first quantum dot film layer on a side of a substrate, where the first quantum dot film layer includes a quantum dot, and a first group connected with the quantum dot.

In some embodiments, S100 of forming a first quantum dot film layer on a side of a substrate includes: form the first quantum dot film layer containing the following structural formula on a side of the substrate:

$R_1$—$R_2$—$R_3$ where R1 is a coordinating group connected with the quantum dot, R2 is an aliphatic chain, and R3 is the first group.

Further, S100 of forming a first quantum dot film layer on a side of a substrate includes: form the first quantum dot film layer containing one of the following first groups on a side of the substrate:

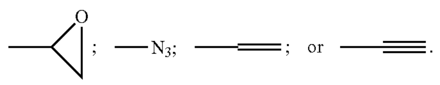

S100 of forming a first quantum dot film layer on a side of a substrate includes:

S101, take a solution containing a quantum dot body into a three-neck flask;

S102, add a toluene solution of oleic acid under a nitrogen atmosphere;

S103, perform stirring at room temperature for a third period of time, to complete exchange;

S104, add the solution into ethanol after the reaction to obtain sediments, perform centrifuging, and discard the supernatant;

S105, add the toluene to dissolve the sediments, then add same into ethanol to obtain sediments again, discard the supernatant after centrifugation, and add toluene to prepare a solution of the quantum dot solution; and S106, coat the quantum dot solution on one side of the substrate.

S200, form a solution containing a modification ligand on a side of the first quantum dot film layer facing away from the substrate, where the modification ligand includes a fluorine-containing aromatic hydrocarbon structure, and a second group connected with the fluorine-containing aromatic hydrocarbon structure.

In some embodiments, S200 of forming a solution containing a modification ligand on a side of the first quantum dot film layer facing away from the substrate includes: form a modification ligand containing the following structural formula on the side of the first quantum dot film layer facing away from the substrate: Y—$R_5$, where Y is a fluorine-containing aromatic hydrocarbon structure, and R5 is a second group.

Further, S200 of forming a solution containing a modification ligand on a side of the first quantum dot film layer facing away from the substrate includes: form a modification ligand containing the second group on the side of the first quantum dot film layer facing away from the substrate, and the second group includes one of:

—OH; or

—$N_3$.

In some embodiments, S200 of forming a solution containing a modification ligand on a side of the first quantum dot film layer facing away from the substrate includes: dropping a perfluoromethyl cyclohexane solution containing 1-hydroxy decafluorobiphenyl and PAG on the first quantum dot film layer; where the 1-hydroxy decafluorobiphenyl includes a second group —OH, and a fluorine-containing aromatic hydrocarbon structure

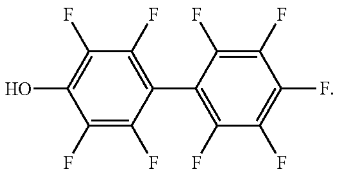 [SMILES: Oc1c(F)c(F)c(-c2c(F)c(F)c(F)c(F)c2F)c(F)c1F]

S300, cause a grafting reaction between the first group and the second group under a preset condition, to form a bonding structure, so as to link the fluorine-containing aromatic hydrocarbon structure to the quantum dot by means of the bonding structure.

In some embodiments, S300 of causing a grafting reaction between the first group and the second group under a preset condition, to form a bonding structure may include: cause the first group to react with the second group by light or heat. In particular, ultraviolet light is used for irradiation for a first period of time, to graft the first group and the second group. Accordingly, the first group and the second group are groups that can have a photoreaction or a thermal reaction.

In some embodiments, after S300, that is, after the step of causing a grafting reaction between the first group and the second group under a preset condition, the manufacturing method further includes: after irradiation is complete, remove the excess solvent by spin-coating, perform washing with ethanol at least three times, and perform annealing for a second period of time.

In order to more clearly understand the manufacturing method for the quantum dot film layer according to the embodiments of the present disclosure, the method is further illustrated as follows.

Prepare quantum dots for a QLED device: set the original quantum dots QD as CdSe/ZnS quantum dots, a ligand molecule A as oleic acid, the solvent as toluene, and a concentration as 10 mg/ml; take 100 mg of quantum dots, place 10 ml into a 50 ml three-neck flask, add 5 ml of a toluene solution (with a concentration of 100 mg/ml) of the ligand molecule A under a nitrogen atmosphere, and performing stirring at room temperature for 24 hours to complete the exchange; after the reaction, add the solution into ethanol to obtain sediments, perform centrifugation in 8000 rpm, and discard the supernatant; and add the toluene to dissolve the sediments, then add same into ethanol to obtain sediments again, discard the supernatant after centrifugation, and add the toluene to prepare a solution of 15 mg/ml.

Prepare the QLED device: spin-coat a substrate (the substrate may be have indium tin oxide (ITO) formed) with PEDOT in 4000 rpm, and perform annealing at 120° C. for 5 minutes; spin-coat a hole transport material in 3000 rpm, and perform annealing at 230° C. for 20 minutes after spin-coating is completed; spin-coat a configured quantum dot solution in 2000 rpm; dropping a perfluoromethyl cyclohexane solution containing 1-hydroxy decafluorobiphenyl (30%) and PAG (1%) on the quantum dot film layer, use ultraviolet (UV) light of 365 nm for irradiation for 200 mj, after irradiation is completed, remove the excess solvent by spin-coating, perform washing with ethanol three times, and perform annealing at 150° C. for 20 minutes; spin-coat a zinc oxide nanoparticle solution of 30 mg/ml in 2000 rpm, and perform annealing at 120° C. for 10 minutes; and vacuum evaporate an aluminum electrode for 150 nm, and then perform encapsulation to form the QLED device.

While the preferred embodiments of the present disclosure have been described, additional alterations and modifications to those embodiments can be made by those skilled in the art once the basic inventive concept are learnt by those skilled in the art. Therefore, it is intended that the appended claims are to be interpreted to include the preferred embodiments and all alterations and modifications that fall within the scope of the present disclosure.

Apparently, those skilled in the art can make various modifications and variations the embodiments of the present disclosure without departing from the spirit and scope of the embodiments of the present disclosure. In this way, if the amendments and variations to the embodiments of the present disclosure fall within the scope of claims of the present disclosure and the equivalents thereof, it is intended that the present disclosure also include these amendments and variations.

What is claimed is:

1. A quantum dot film layer, comprising:

a quantum dot;

a bonding structure, one end of the bonding structure being connected with the quantum dot; and a fluorine-containing aromatic hydrocarbon structure, the fluorine-containing aromatic hydrocarbon structure being connected with the other end of the bonding structure to connect with the quantum dot by means of the bonding structure;

wherein the quantum dot film layer further comprises: a coordinating group connected with the quantum dot, wherein the bonding structure is connected with the quantum dot by means of the coordinating group;

wherein the quantum dot film layer further comprises: an aliphatic chain connected between the coordinating group and the bonding structure.

2. The quantum dot film layer according to claim 1, wherein a general formula of the fluorine-containing aromatic hydrocarbon structure comprises at least one of:

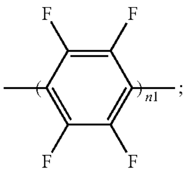 ; or

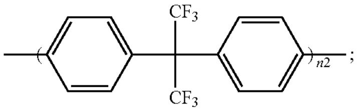 ;

wherein n1≤6, and n2≤6.

3. The quantum dot film layer according to claim 1, wherein the bonding structure comprises one of:

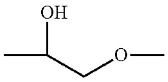 ; 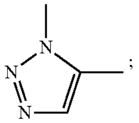 ; or —O—.

4. The quantum dot film layer according to claim 1, wherein the bonding structure is formed by a grafting reaction of a first group and a second group, the first group is a group connected with the quantum dot before the grafting reaction, and the second group is a group connected with the fluorine-containing aromatic hydrocarbon structure before the grafting reaction.

5. The quantum dot film layer according to claim 4, wherein the first group comprises one of:

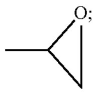 ; —$N_3$;  ; or  .

6. The quantum dot film layer according to claim 4, wherein the second group comprises one of:

—OH; or

—$N_3$.

7. The quantum dot film layer according to claim 1, wherein the coordinating group comprises one of:

a mercapto group;

an amino group; or a carboxyl group.

8. The quantum dot film layer according to claim 1, wherein a quantity of carbon atoms of a backbone carbon chain of the aliphatic chain is greater than 0 and less than or equal to.

9. The quantum dot film layer according to claim 1, comprising a structure as follows:

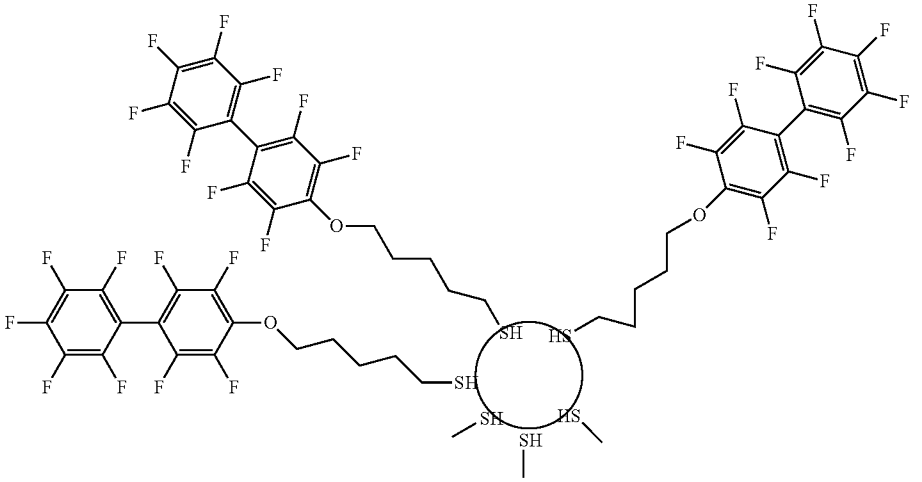

-continued

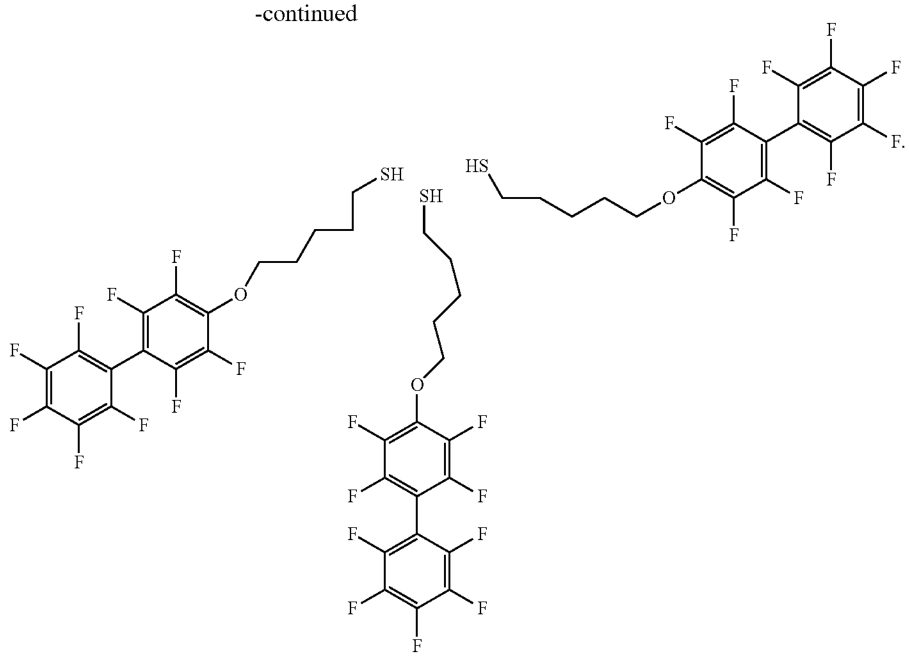

10. The quantum dot film layer according to claim 4, wherein a maximum distance between the quantum dot and the fluorine-containing aromatic hydrocarbon structure is greater than a first distance; and the first distance is a distance between an end of the first group facing away from the quantum dot and the quantum dot before the grafting reaction.

11. The quantum dot film layer according to claim 4, wherein a distance between adjacent quantum dots is greater than a second distance, and the second distance is a distance between two adjacent quantum dots before the grafting reaction.

12. A quantum dot light-emitting device, comprising the quantum dot film layer according to claim 1.

13. A manufacturing method for a quantum dot film layer, comprising:

forming a first quantum dot film layer on a side of a substrate, wherein the first quantum dot film layer comprises a quantum dot, and a first group connected with the quantum dot;

forming a solution containing a modification ligand on a side of the first quantum dot film layer facing away from the substrate, wherein the modification ligand comprises a fluorine-containing aromatic hydrocarbon structure, and a second group connected with the fluorine-containing aromatic hydrocarbon structure; and causing a grafting reaction between the first group and the second group under a preset condition, to form a bonding structure, so as to link the fluorine-containing aromatic hydrocarbon structure to the quantum dot by means of the bonding structure;

wherein the quantum dot film layer further comprises: a coordinating group connected with the quantum dot, wherein the bonding structure is connected with the quantum dot by means of the coordinating group;

wherein the quantum dot film layer further comprises: an aliphatic chain connected between the coordinating group and the bonding structure.

14. The manufacturing method according to claim 13, wherein the forming a first quantum dot film layer on a side of a substrate comprises: forming the first quantum dot film layer containing a structural formula on a side of the substrate, and the structural formula is as follows:

$R_1$—$R_2$—$R_3$, wherein R1 is a coordinating group connected with the quantum dot, R2 is an aliphatic chain, and R3 is the first group.

15. The manufacturing method according to claim 14, wherein the forming a first quantum dot film layer on a side of a substrate comprises: forming the first quantum dot film layer containing the first group on a side of the substrate, and the first group comprises one of:

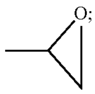; $—N_3$; ; or .

16. The manufacturing method according to claim 13, wherein the forming a solution containing a modification ligand on a side of the first quantum dot film layer facing away from the substrate comprises: forming the modification ligand containing a structural formula on a side of the first quantum dot film layer facing away from the substrate, and the structural formula is as follow:

Y—$R_5$; wherein Y is the fluorine-containing aromatic hydrocarbon structure, and R5 is the second group.

17. The manufacturing method according to claim 16, wherein the forming a solution containing a modification ligand on a side of the first quantum dot film layer facing away from the substrate comprises: forming the modification ligand containing the second group on a side of the first quantum dot film layer facing away from the substrate, and the second group comprises one of:

—OH; or $—N_3$.

18. The manufacturing method according to claim 13, wherein the causing a grafting reaction between the first group and the second group under a preset condition comprises:

causing the first group to react with the second group by light or heat.

* * * * *